United States Patent [19]
Takashima

[11] Patent Number: 5,811,991
[45] Date of Patent: Sep. 22, 1998

[54] LOGIC CIRCUIT AND SEMICONDUCTOR DEVICE USING IT

[75] Inventor: Daisaburo Takashima, Yokohama, Japan

[73] Assignee: Kabushiki Kaisha Toshiba, Kawasaki, Japan

[21] Appl. No.: 613,086

[22] Filed: Mar. 8, 1996

[30] Foreign Application Priority Data

Mar. 10, 1995 [JP] Japan ................................. 7-050981

[51] Int. Cl.$^6$ ................... H03K 19/096; H03K 19/0175
[52] U.S. Cl. ............................... 326/97; 326/68; 326/87; 326/88; 326/28; 326/33; 326/91; 326/92
[58] Field of Search ................................ 326/86, 87, 68, 326/28, 33, 88, 121, 90, 91, 92, 81, 97

[56] References Cited

U.S. PATENT DOCUMENTS

| | | | |
|---|---|---|---|
| 4,498,021 | 2/1985 | Uya | 326/86 |
| 4,647,797 | 3/1987 | Sanwo et al. | 326/86 |
| 5,117,131 | 5/1992 | Ochi et al. | 326/81 |
| 5,457,420 | 10/1995 | Asada | 326/81 |
| 5,543,734 | 8/1996 | Volk et al. | 326/81 |

OTHER PUBLICATIONS

L. Svensson, et al., "Driving a Capacitive Load Without Dissipating fCV$^2$", 1994 IEEE Symposium on Low Power Electronics, (pp. 100–101), 1994.

*Primary Examiner*—Edward P. Westin
*Assistant Examiner*—Richard Roseen
*Attorney, Agent, or Firm*—Oblon, Spivak, McClelland, Maier & Neustadt, P.C.

[57] ABSTRACT

A logic circuit comprises an output line, a first switch having an end connected to the output line and another end connected to a power source potential, a second switch having an end connected to the output line and another end connected to a ground potential, and a switching/rectifying circuit, which has an end connected to the output line and another end connected to an intermediate power source potential, for switching/rectifying, in which said intermediate power source potential is higher than the ground potential and lower than the power source potential. With this configuration, said switching/rectifying circuit includes a third switch and a rectifier connected in series.

16 Claims, 9 Drawing Sheets

LOGIC CIRCUIT AND SEMICONDUCTOR DEVICE USING IT

BACKGROUND OF THE INVENTION

1. Field of the Invention

The present invention relates to a logic circuit used in a semiconductor device or a combination of individual semiconductors, and particularly, to a logic circuit which reduces the power dissipation and a semiconductor device using the same.

2. Description of the Related Art

FIG. 1A shows a circuit configuration of a conventional logic circuit such as a CMOS inverter formed of a MOS transistor, and FIG. 1B shows an operating waveform thereof.

As an input rises from the grounded potential (GND) to a power source potential (Vcc), an output inversely falls from the GND to the Vcc. When the output rises from the GND to the Vcc, heat is generated and energy is dissipated by a resistance inside a p-MOS transistor the resistance, until a load C is charged by the resistance when a p-MOS transistor is turned ON. This energy is expressed as $C \cdot Vcc^2/2$. Similarly, when the output falls from the power source potential Vcc to the GND, heat is generated by a resistance inside an n-MOS transistor, and the energy dissipated thereby is expressed as $C \cdot Vcc^2/2$. In general, the energy dissipated during one cycle in which the output change from Vcc to GND to VCC is expressed as follows.

$$C \cdot Vcc^2/2 + C \cdot Vcc^2/2 = C \cdot Vcc^2$$

The dissipated energy is therefore expressed as $C \cdot Vcc^2 \cdot f$ where the frequency is f.

Thus, the dissipated energy in a logic circuit is essentially defined by $C \cdot Vcc^2/2$, and therefore, the dissipated energy cannot be reduced as long as the Vcc is not reduced. Although the power dissipation is reduced by reducing the Vcc, the lower limit of the Vcc is restricted by the threshold voltages Vtp and Vtn of MOS transistors. For example, reduction in the value of the Vcc results in a problem that the operating speed is decreased.

There is a known method which is used to solve the above problem. In this method, a plurality of power sources having intermediate potentials between the power source potential Vcc and the ground potential GND are prepared through switching elements (transistors). When the output potential is increased, the switching elements are switched in an order from the switching element connected to the smallest intermediate power source potential, thereby increasing the output potential. When the output potential is decreased, the switching elements are switched in a reversed order from the switching element connected to the greatest intermediate power source potential, thereby decreasing the output potential. In this method, since the intermediate power source potentials are connected with only the switching elements, a through-current may flow between connected switch elements each other if the switching elements are switched at a overlapped timing. Therefore, when one switching element is closed while increasing or decreasing the potential, the other switching elements must be opened. As a result, switching must be carried out for every switching stage. Therefore, high-speed operation cannot be achieved in this method.

As has been explained above, a conventional logic circuit has an voltage swing Vcc, the dissipated energy at the time of switching is essentially $C \cdot Vcc^2/2$ with respect to a load capacity C, and the dissipated energy cannot be reduced as long as Vcc is not reduced.

In addition, there is another known method in which the dissipated energy is reduced by increasing or decreasing the potential in a plurality of stages. However, in this method, the operating speed is low since switching must be performed for every switching stage.

SUMMARY OF THE INVENTION

The present invention has an object of providing a logic circuit which reduces the dissipated energy to be smaller than $C \cdot Vcc^2/2$ at the time of switching even when the output has an voltage swing of Vcc, so that timings of switching need not be considered.

In order to achieve the above object, the present invention adopts the following structure.

A logic circuit according to the present invention is characterized by comprising: an output line; a first switch having an end connected to the output line and another end connected to a power source potential; a second switch having an end connected to the output line and another end connected to a ground potential; and a switching/rectifying circuit, which has an end connected to the output line and another end connected to an intermediate power source potential, for switching/rectifying, in which the intermediate power source potential is higher than the ground potential and lower than the power source potential. The switching/rectifying circuit includes a third switch and a rectifier connected in series. The rectifier includes at least one of a pn-junction element and a MOS transistor.

Another logic circuit according to the present invention is characterized by comprising: an output line; a first switch having an end connected to the output line and another end connected to a power source potential; a second switch having an end connected to the output line and another end connected to a ground potential; and a plurality of first and second switching/rectifying circuits, each of which has an end connected to the output line and another end connected in parallel to each of a plurality of intermediate power source potentials, respectively, which are different from each other and are higher than the ground potential and lower than the power source potential, wherein the first switching/rectifying circuits respectively allow currents to flow when the potential of the output line is lower than associated ones of the intermediate power source potentials, and the second switching/rectifying circuits respectively allow currents to flow when the potential of the output line is higher than associated ones of the intermediate power source potentials. Each of the first switching/rectifying circuits includes a third switch and a first rectifying circuit, and each of the second switching/rectifying circuits includes a fourth switch and a second rectifying circuit. Each of the first and second rectifying circuits includes at least one of a pn-junction element and a MOS transistor.

A semiconductor device according to the present invention comprises at least one of a clock generator and a data line, each of which uses the logic circuit according to the present invention. For example, the logic circuit of the present invention may be applicable to a clock drive line in an integrated circuit, a part of a circuit which has a large load, such as an output buffer or the like, and a bus circuit whose dissipated energy is large.

Preferred embodiments of the logic circuit of the present invention are as follows.

(1) The potential of the output line is within a range of the ground potential and the power source potential, when the potential of the output line falls from the power source potential to the ground potential, the fourth switches of the second switching/rectifying circuits are turned ON, one after another, in an order from the fourth switch of that second switching/rectifying circuit which is connected to the highest one of the intermediate power source potential, and finally, the second switch is turned ON, and when the potential of the output line rises from the ground potential to the power source potential, the third switches of the first switching/rectifying circuits are turned ON, one after another, in an order from the third switch of that first switching/rectifying circuit which is connected to the lowest one of the intermediate power source potential, and finally, the first switch is turned ON.

(2) At least two of the first to fourth switches are simultaneously kept turned ON during operation to make the potential of the output line rise and fall.

(3) A stabilizing capacitance connected to the intermediate power source potential or potentials are further comprised.

(4) The intermediate power source potential or potentials are generated inside a circuit included in a semiconductor chip.

(5) The intermediate power source potential or potentials are directly generated by an AC/DC converter other than a circuit included in a semiconductor chip.

In the above structure, a case of reducing the output potential from the power source potential (Vcc) to the ground potential (GND) will be explained.

At first, for example, the switch connected to the highest potential among a plurality of different intermediate power source potentials ($V_{m1}$ to $V_{m(n-1)}$), e.g., the fourth switch is turned ON, so that a current flows from the Vcc to the $V_{m1}$ due to the potential difference (Vcc–$V_{m1}$) between the power source potential (Vcc) and the intermediate power source potential ($V_{m1}$). In this state, heat energy of $C \cdot (Vcc-V_{m1})^2/2$ is dissipated in the ON-resistance of the fourth switch. It is needless to say that the dissipated energy is smaller than that in a conventional circuit in which the potential rises, as an voltage swing, from the power source potential (Vcc) to the ground potential (GND). Besides, the dissipated energy is reduced in proportion to the square of the potential difference, since the potential difference of the voltage drop is small.

In the next, the third switch of the second lowest intermediate power source potential ($V_{m2}$) is turned ON, so that the output decreases from $V_{m1}$ to $V_{m2}$, and the power dissipation becomes $C \cdot (V_{m1}-V_{m2})^2/2$, likewise. In this state, even if the fourth switch connected to an intermediate power source potential $V_{m1}$ having a higher potential than the intermediate power source potential $V_{m2}$ is kept turned ON, the second rectifier prevents a current from flowing when the output potential decreases to be lower than $V_{m1}$. Therefore, a leakage from a higher intermediate power source potential (e.g., $V_{m1}$) to an output portion (or output line) does not occur. Likewise, after the output potential decreases to the lowest power source potential, the second switch connected to the ground potential GND is turned ON and the output potential thereby decreases to the ground potential GND. The switch connected to the ground potential GND does not require a rectifier since no power source potential is lower than the potential of the switch.

From the above, for example, in case where (n–1) intermediate power source potentials are prepared by dividing equally the difference between the power source potential Vcc and the GND by n, the dissipated energy will be as follows when the output changes from the power source potential Vcc to GND.

$$\{C \cdot (Vcc/n)^2 \times n\}/2 = \{C \cdot (Vcc)^2/2\}/n$$

This power dissipation is reduced to 1/n in comparison with the power dissipation $C \cdot (Vcc/2)^2/2$ of a conventional circuit. When the output changes from the GND to the power source potential Vcc, the third switches connected to a plurality of intermediate power source potentials ($V_{m1}$ to $V_{m(n-1)}$) are sequentially turned ON, in an order from the switch connected to the lowest intermediate power source potential, like in the above case.

Further, since rectifiers are used, the present invention can be realized only by turning ON switches respectively connected to the intermediate power source potential, with slight delays interposed therebetween. Specifically, a current switch need not be turned OFF before turning ON a next switch. Therefore, the power source potential can be automatically switched with a very high speed. In addition, the switch of the intermediate power source potential once turned ON may be slowly turned OFF before the output changes from the GND to the power source potential Vcc or from the power source potential to the GND for the next time. Therefore, it is not necessary to consider designing of timings.

As explained above, according to the present invention, it is possible to realize a logic circuit whose output can be fully swung at a high speed without timing losses, by providing a plurality of intermediate power sources as well as switches and rectifiers connected to the intermediate power sources, and whose energy dissipated at the time of switching can be reduced to be smaller than $C \cdot (Vcc/2)^2/2$ even if the voltage swing of the output is the power source voltage Vcc.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE PREFERRED EMBODIMENTS

In the following, embodiments of the present invention will be explained with reference to the drawings.

(Embodiment 1)

Figure 1A:
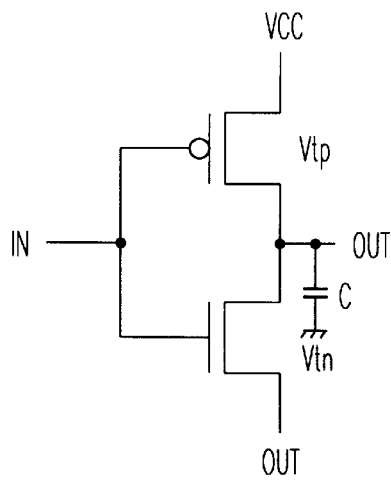
FIGS. 1A and 1B show respectively a circuit configuration and an operating timing chart of a conventional CMOS inverter.
Figure 1B:
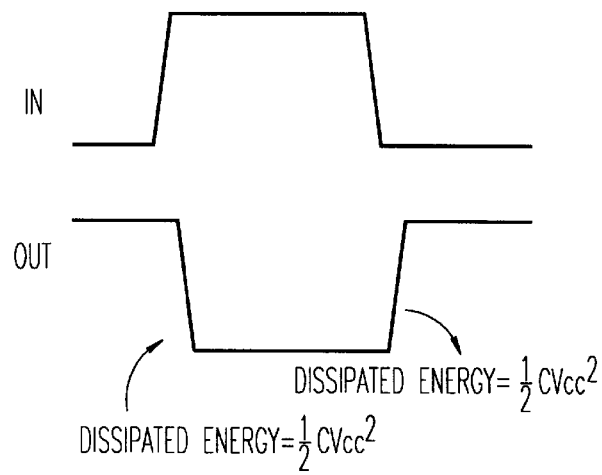
Figure 2:
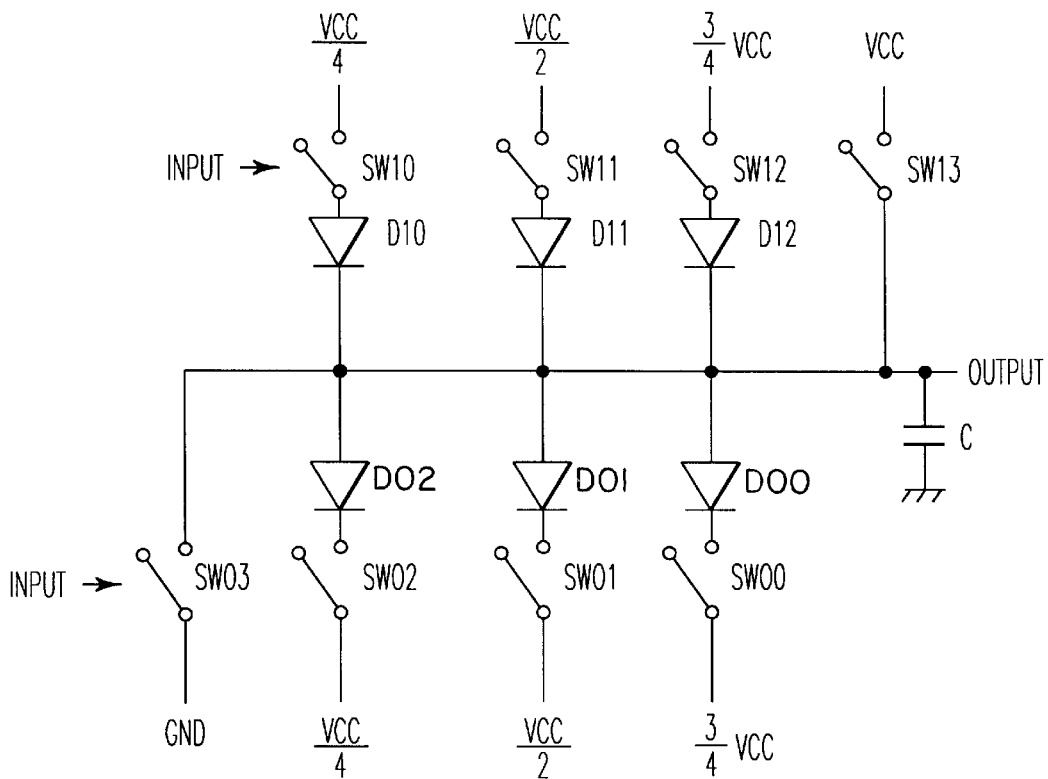
FIG. 2 shows a circuit configuration of a logic circuit according to a first embodiment.

FIG. 2 shows a circuit configuration of a logic circuit according to a first embodiment of the present invention.

In FIG. 2, intermediate power source potentials Vcc/4, Vcc/2, and 3·Vcc/4, defined by dividing the power source potential Vcc by four, are given between the power source potential Vcc and the grounded potential GND. Each of these intermediate power source potentials is connected to two rectifies, such as diodes, having rectifying directions different from each other, and is further connected to an output line through two switches connected in series to the rectifiers, e.g., the intermediate power source potentials are respectively connected to rectifiers $D_{00}$, $D_{01}$, and $D_{02}$ as well as $D_{10}$, $D_{11}$ and $D_{12}$, and are also respectively connected to an output line through switches $SW_{00}$, $SW_{01}$, and $SW_{02}$, as well as $SW_{12}$, $SW_{11}$, and $SW_{10}$. Each of the Vcc and GND is connected to the output line through only one switch.

More specifically, the Vcc is connected to the output line through a first switch $SW_{13}$, while the GND is connected to the output line through a second switch $SW_{03}$.

The intermediate power source potential 3·Vcc/4 is connected to a main power line through two serial circuits connected in parallel with each other, one of which is a serial circuit consisting of a third switch $SW_{12}$ and a first rectifier $D_{12}$, and the other of which is a serial circuit consisting of a fourth switch $SW_{00}$ and a second rectifier $D_{00}$.

The intermediate power source potential Vcc/2 is connected to the main power line through two serial circuits connected in parallel with each other, one of which is a serial circuit consisting of a third switch $SW_{11}$ and a first rectifier $D_{11}$, and the other of which is a serial circuit consisting of a fourth switch $SW_{01}$ and a second rectifier $D_{01}$.

The intermediate power source potential Vcc/4 is connected to the main power line through two serial circuits connected in parallel with each other, one of which is a serial circuit consisting of a third switch $SW_{10}$ and a first rectifier $D_{10}$, and the other of which is a serial circuit consisting of a fourth switch $SW_{02}$ and a second rectifier $D_{02}$.

Figure 12:
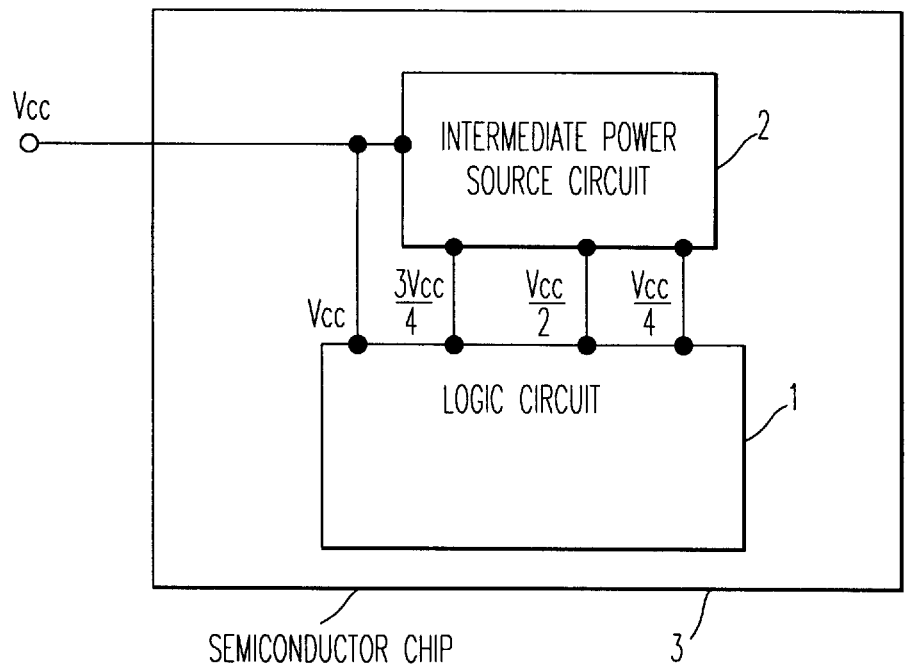
FIG. 12 is a diagram showing a logic circuit corresponding to any one of the embodiments in which intermediate power source potentials are obtained internally on the semiconductor chip.

Here, the intermediate power source potentials may be inputted from outside the semiconductor chip (FIG. 13), or may be obtained by internally attaching a large stabilizing capacitor to the power source (FIG. 12). In order to stabilize the intermediate power source potentials, it is preferable to provide a large stabilizing capacitance. Further, each of the switches is turned ON and OFF by an input signal, thereby changing the voltage swing of the output potential from Vcc to GND.

Figure 3:
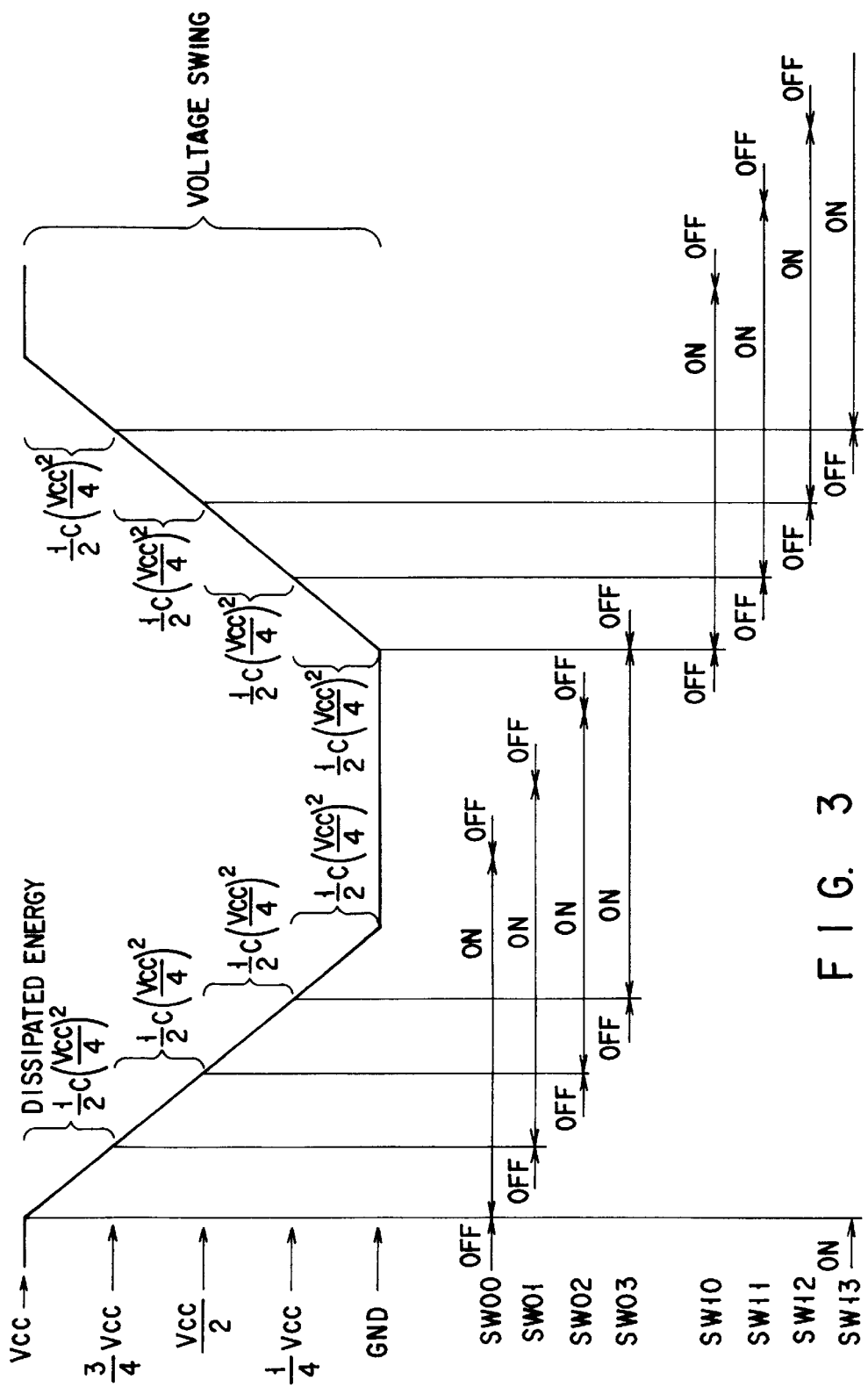
FIG. 3 is an operating timing chart for explaining the operation according to the first embodiment.

FIG. 3 is a operating timing chart of this embodiment, and the operation of this embodiment will be explained with reference to the FIGS. 2 and 3.

An example will be explained in which the output potential is decreased from the power source potential Vcc to the grounded potential GND.

At first, only the switch $SW_{00}$ is turned ON which is connected to the highest intermediate power source potential 3·Vcc/4. Then, electric charges stored in the output load capacitance C flow through the rectifier $D_{00}$ to the power source 3·Vcc/4, so that the output becomes 3·Vcc/4. In this state, heat energy is dissipated by the internal resistance of the switch $SW_{00}$. With respect to this heat energy, since the potential difference between the output and the 3·Vcc/4 is small, the dissipated energy is expressed as $C·(Vcc/4)^2/2$.

In the next, when the switch $SW_{01}$ of the second highest intermediate power source potential Vcc/2 is turned ON, the output is connected to the intermediate power source potential Vcc/2 through the switch $SW_{02}$, and falls to Vcc/2. In this state, the rectifier can serve, due to its rectifying function, to eliminate a current which flows back into the power of the intermediate power source potential 3·Vcc/4 through the $SW_{00}$. Therefore, the switch $SW_{00}$ need not be turned OFF when the switch $SW_{01}$ is turned ON. As a result, it is possible to reduce a time difference from when the $SW_{00}$ is turned ON to when the $SW_{01}$ is turned ON, so that the output can be raised or fallen at a high speed.

Next, the switch $SW_{02}$ is turned ON, and the output is changed to Vcc/4 with use of the power source of Vcc/4. Finally, the switch $SW_{03}$ is turned ON and the output is fallen to the GND. Since the output cannot be reduced any more, the switch $SW_{03}$ connected to the GND does not require a rectifier. However, the operation can be achieved if any rectifier is provided. Every time when the output thus changes from the Vcc to the 3·Vcc/4, from the 3·Vcc/4 to the Vcc/2, from the Vcc/2 to the Vcc/4, and from the Vcc/4 to the GND, heat energy of $C·(Vcc/4)^2/2$ is dissipated. In comparison with a conventional case where the power dissipation is $C·(Vcc)^2/2$, the present embodiment is reduced as follows.

$$\{4 \times C·(Vcc/4)^2/2\}/\{C·(Vcc)^2/2\} = ¼$$

Thus, the power dissipation is reduced to 1/n by dividing the power source potential Vcc by n, thereby to use (n−1) lines of power sources.

In the next, consideration will be taken into a case where the output changes from the grounded potential GND to the power source potential Vcc.

At first, the switch $SW_{10}$ is turned ON, thereby changing the output to the Vcc/4, and then, the switches $SW_{11}$, $SW_{12}$, and $SW_{13}$ are turned ON in this order, thereby changing the output to Vcc/2, 3·Vcc/4, and to Vcc. In this state, when the output is Vcc/4 or more, a current does not flow to the power source of Vcc/4 due to the rectifiers $D_{10}$, $D_{11}$, and $D_{12}$ even though the switch $SW_{10}$ is turned ON. When the output is Vcc/2 or more and when the output is 3·Vcc/4 or more, a current does not flow to the power sources of Vcc/2 and 3·Vcc/4 even though the switches $SW_{11}$ and $SW_{12}$ are turned ON. As in the above, the output can be pulled up at a high speed, by only shifting the timings at which the switches $SW_{10}$, $SW_{11}$, $SW_{12}$, and $SW_{13}$ are turned ON, and besides, the consumption of heat energy can be reduced to ¼ of a conventional method.

Figure 13:
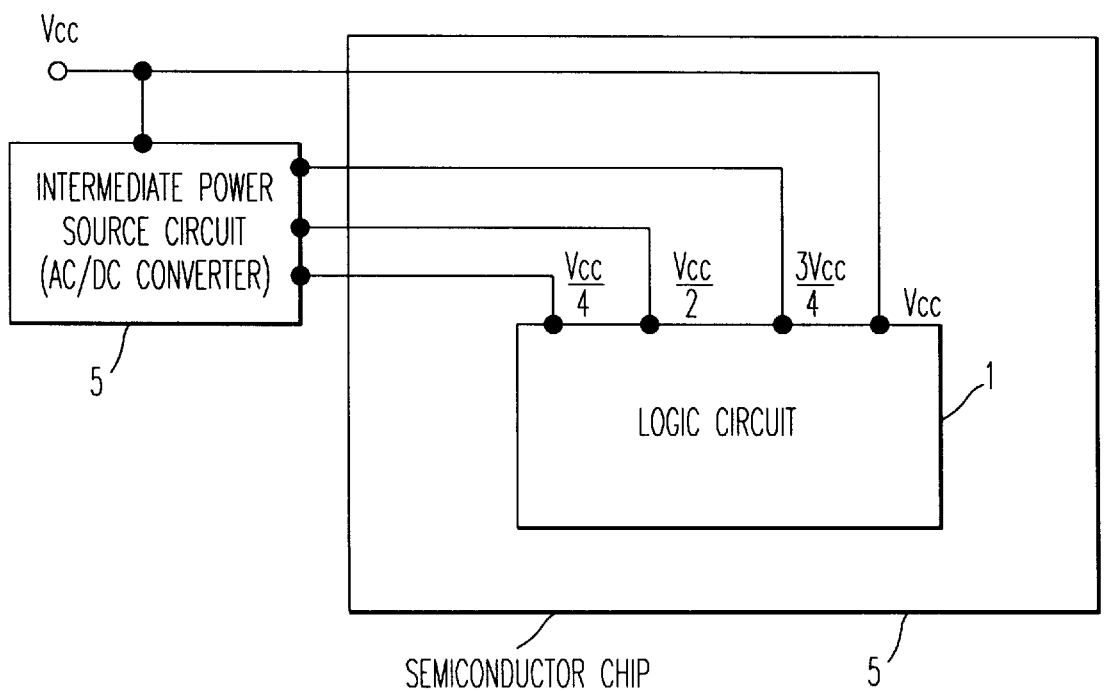
FIG. 13 is a diagram of a logic circuit of any one of the embodiments in which intermediate power source potentials are obtained from a source outside the semiconductor chip.

In this case, the intermediate power source potentials may be inputted from outside the chip or may be internally generated within the chip, as shown in FIGS. 13 and 12, respectively. In case of internally generating the intermediate power source potentials within the chip, if the intermediate power source potentials Vcc/4, Vcc/2, and 3·Vcc/4 are once precharged in a large capacitor when the power source is turned ON, these intermediate power source potentials are maintained to be constant even if the output is repeatedly pulled up and pulled down. This is because, for example, when the switch SW$_{00}$ is turned ON thereby to change the output from Vcc to 3·Vcc/4, charge Q=C·(Vcc/4) flow from the capacitance C of the output to the power source of 3·Vcc/4, and therefore, the potential slightly exceeds 3·Vcc/4. Inversely, when the switch 12 is turned ON thereby to change the output from Vcc/2 to 3·Vcc/4, charge Q'=C·(Vcc/4) flows from the power source of 3·Vcc/4 to the capacitance C of the output, and therefore, the potential returned to original value of 3·Vcc/4. Therefore, a large-scale intermediate power source stabilizing circuit is not required, but only a small-scale stabilizing circuit is sufficient.

FIG. 12 shows a logic circuit 1 with intermediate power source potentials obtained from an intermediate power source circuit 2 located internally on the semiconductor chip 3. FIG. 13 shows a logic circuit 1 with intermediate power source potentials obtained from an intermediate power source circuit 4 located outside the semiconductor chip 5. The intermediate power source circuit 4 in FIG. 13 is an AC/DC converter. These figures are simplified to only show the power sources associated with the logic circuit. As stated previously, these figures correspond to all embodiments of the invention.

(Embodiment 2)

Figure 4:
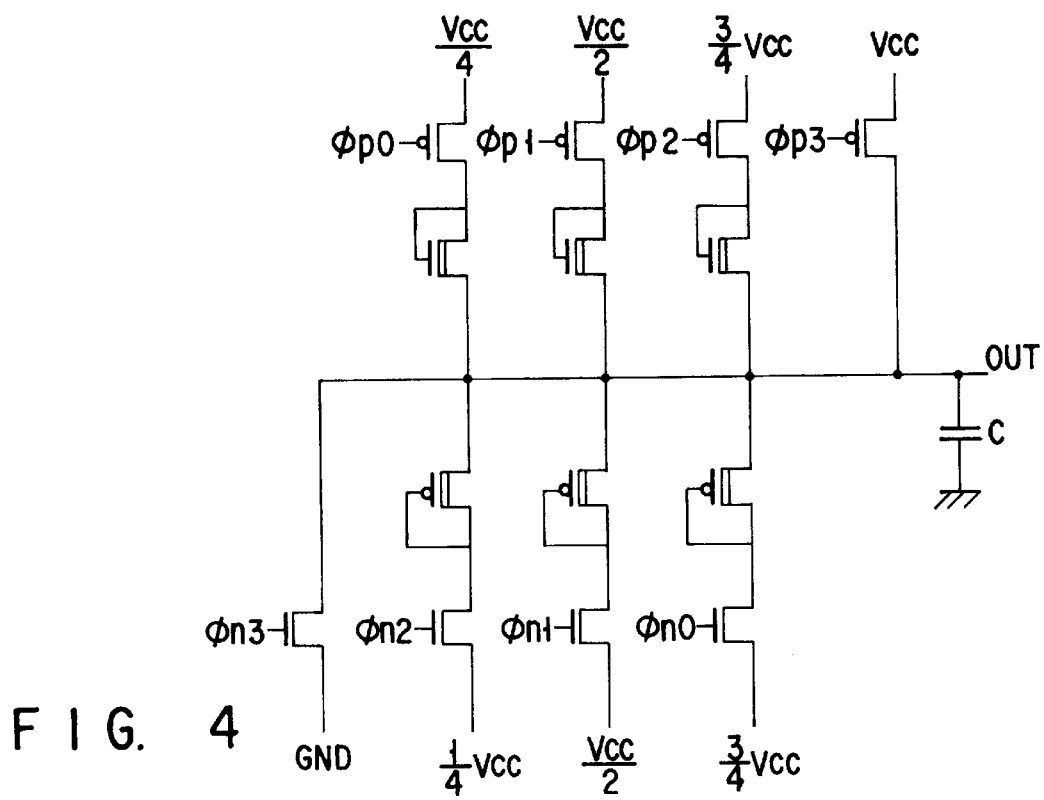
FIG. 4 shows a circuit configuration of a logic circuit according to the second embodiment.

FIG. 4 shows a circuit configuration of a logic circuit according to a second embodiment of the present invention.

This embodiment is different from the first embodiment in that MOS transistors whose gate and drain are connected to each other are used in place of diodes used as rectifiers in the first embodiment. Further, in this embodiment, MOS transistors are used as switches.

A rectifier using a MOS transistor used in this embodiment can be formed of either an n-MOS or p-MOS transistor. In this case, potential drops in the rectifier in the direction in which a current flows can be reduced if an n-MOS or p-MOS transistor having a low threshold value is used to form the rectifier. A switch also may be formed of either an n-MOS or p-MOS transistor. In FIG. 4, the switch for falling the output from the power source potential Vcc to the grounded potential GND is formed of an n-MOS transistor, while the switch for raising the potential from the GND to the Vcc is formed of a p-MOS transistor. When the threshold value of the transistors as the rectifiers is 0 V, the dissipated energy can be reduced to ¼.

Figure 5:
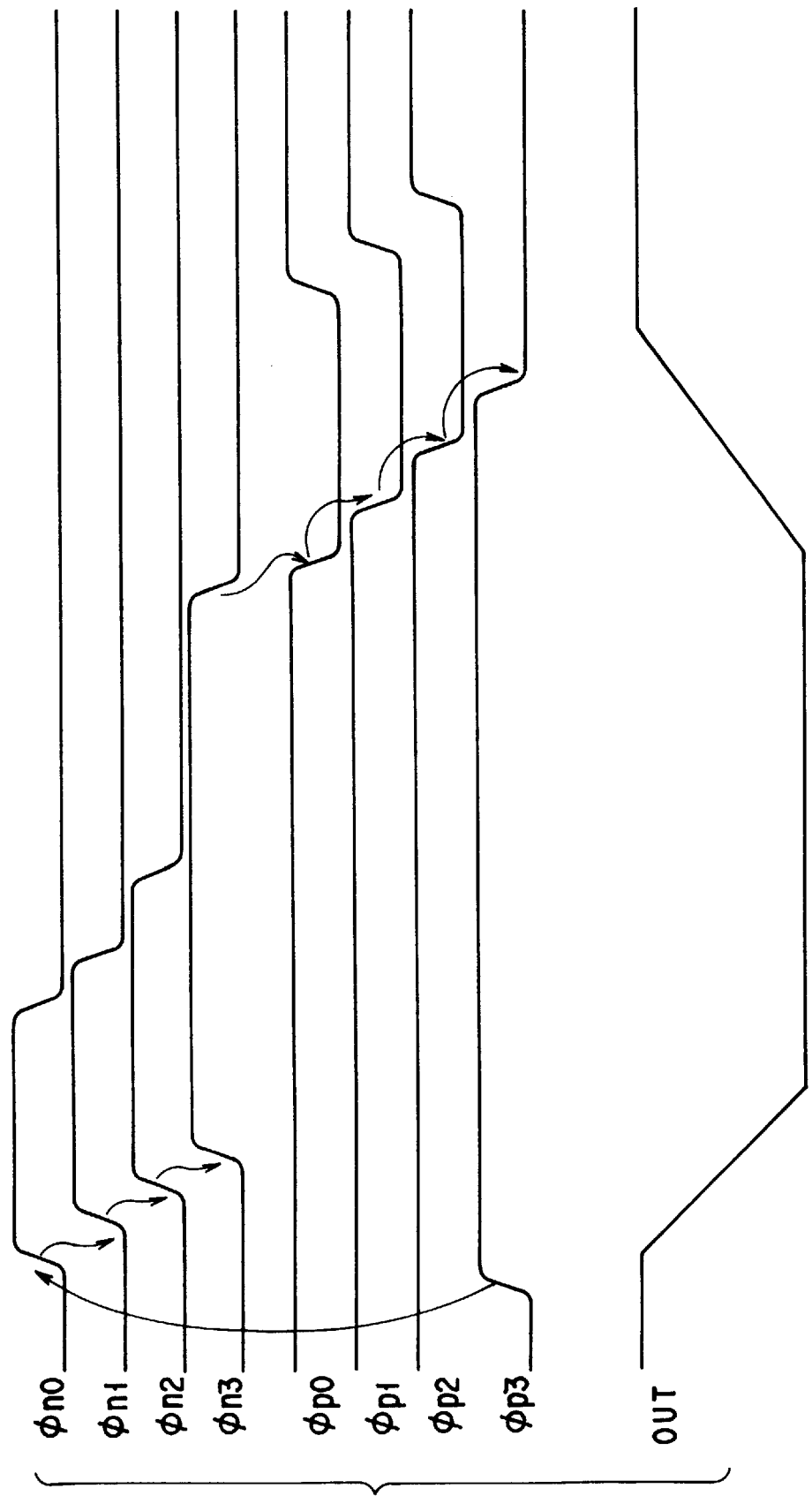
FIG. 5 is an operating timing chart for explaining the operation according to the second embodiment.

FIG. 5 is an operating timing chart according to this embodiment.

In this embodiment, the timing difference between clocks $\phi_{n0}$ and $\phi_{n3}$ as well as the timing difference between clocks $\phi_{p0}$ and $\phi_{p3}$ can be eliminated by using rectifiers, as in the first embodiment, and therefore, the dissipated energy can be reduced. Since the $\phi_{n0}$ need not be low when the $\phi_{n1}$ becomes high (i.e., since the $\phi_{n0}$ need not have a small pulse width), the timing difference between the $\phi_{n0}$ and $\phi_{n1}$ can be easily reduced.

(Embodiment 3)

Figure 6:
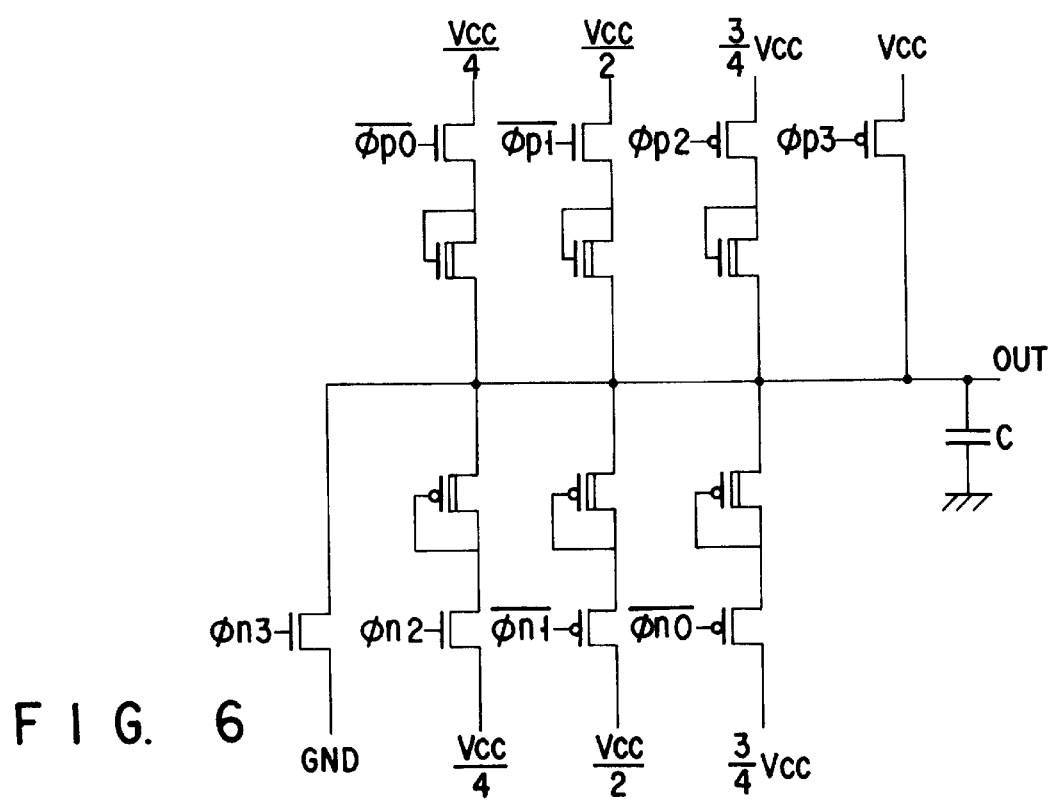
FIG. 6 shows a circuit configuration of a logic circuit according to a third embodiment.

FIG. 6 shows a circuit configuration of a logic circuit according to the third embodiment of the present invention.

This embodiment is different from the second embodiment in that n-MOS and p-MOS transistors are exchanged in a part of switches.

For example, in case of FIG. 4, the $\phi_{n0}$ is changed to Vcc when the output is decreased from Vcc to 3·Vcc/4. However, when switches are formed of n-MOS transistors, the transistor has only a gate-source potential of Vcc−3·Vcc/4=Vcc/4, and therefore, does not operate if the threshold voltage $V_T$>Vcc/4 exists. In contrast, when the output is decreased from Vcc to 3·Vcc/4 in FIG. 6, it is only necessary to change /$\phi_{n0}$ to GND. Since switches are formed of p-MOS transistors, and since the transistor has a gate-source potential of at least 0 V−3·Vcc/4=−3·Vcc/4 which is a large value, the transistor can operate until a relationship of $|V_T|>|3·Vcc/4|$ is satisfied. Thus, there is a margin between Vcc and $V_T$.

Thus, according to this embodiment, a circuit having an excellent operating margin is achieved by selecting such an n-MOS or p-MOS transistor which makes the gate-source potential greater.

Figure 7:
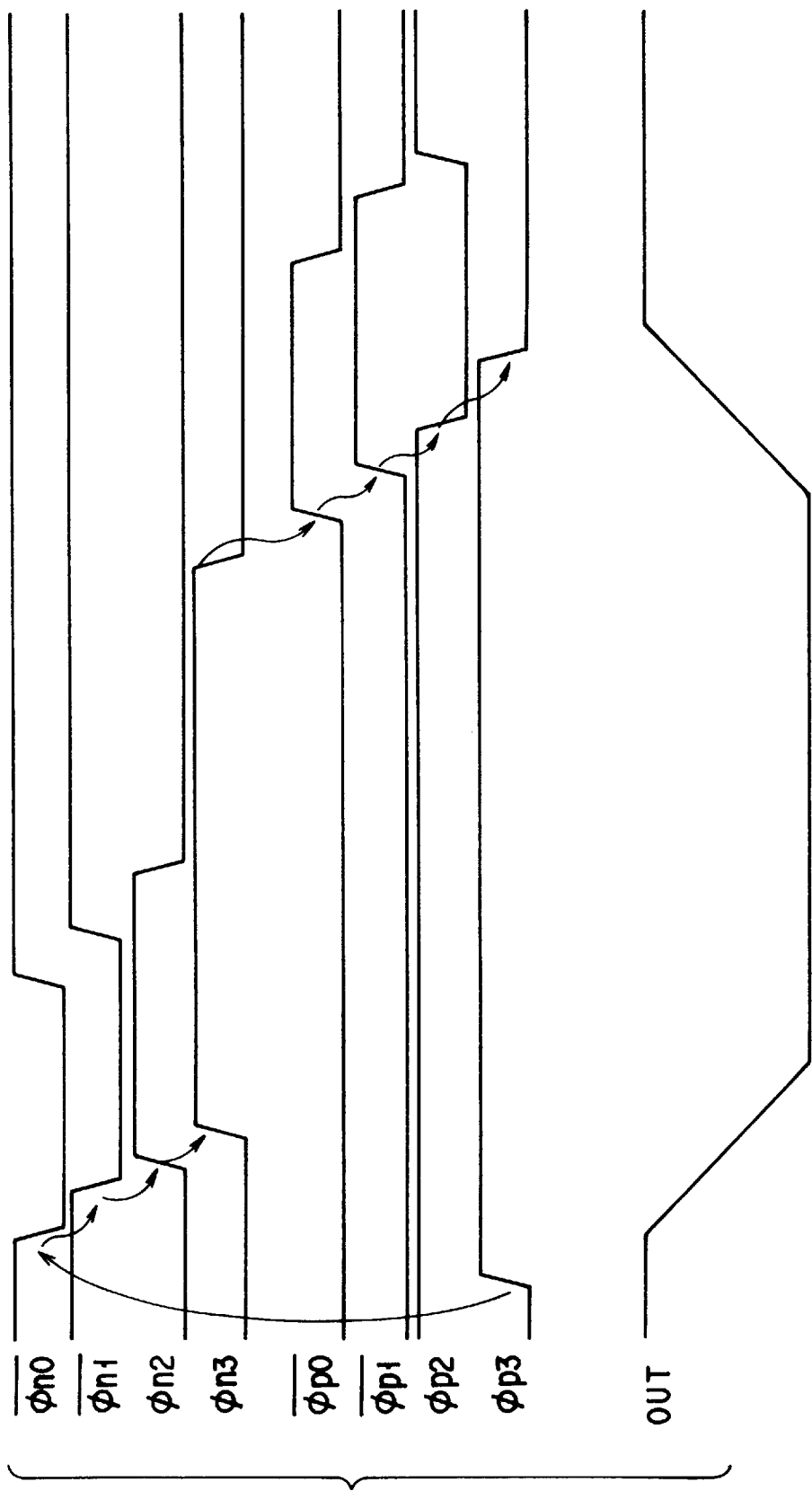
FIG. 7 is an operating timing chart for explaining the operation according to the third embodiment.

FIG. 7 is an operating timing chart of this embodiment. The operating timings are basically similar to the operating timings of FIG. 5, if only the polarities of /$\phi_{p0}$, /$\phi_{p1}$, /$\phi_{n1}$, and /$\phi_{n0}$ are inverted from those of FIG. 5, the circuit operates.

Figure 8:
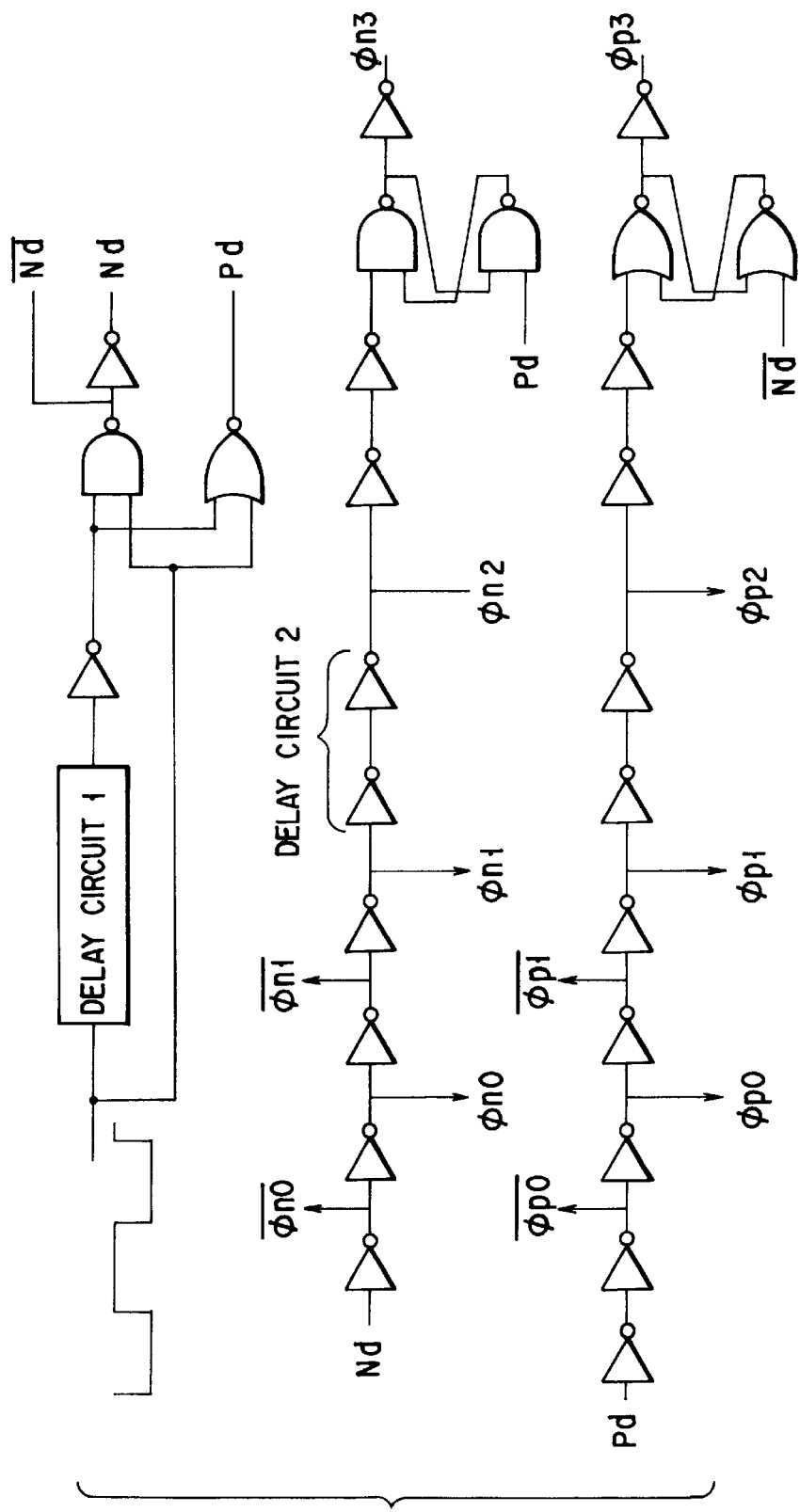
FIG. 8 shows examples of a control circuit for controlling respective switches, according to third and fourth embodiments.
Figure 9:
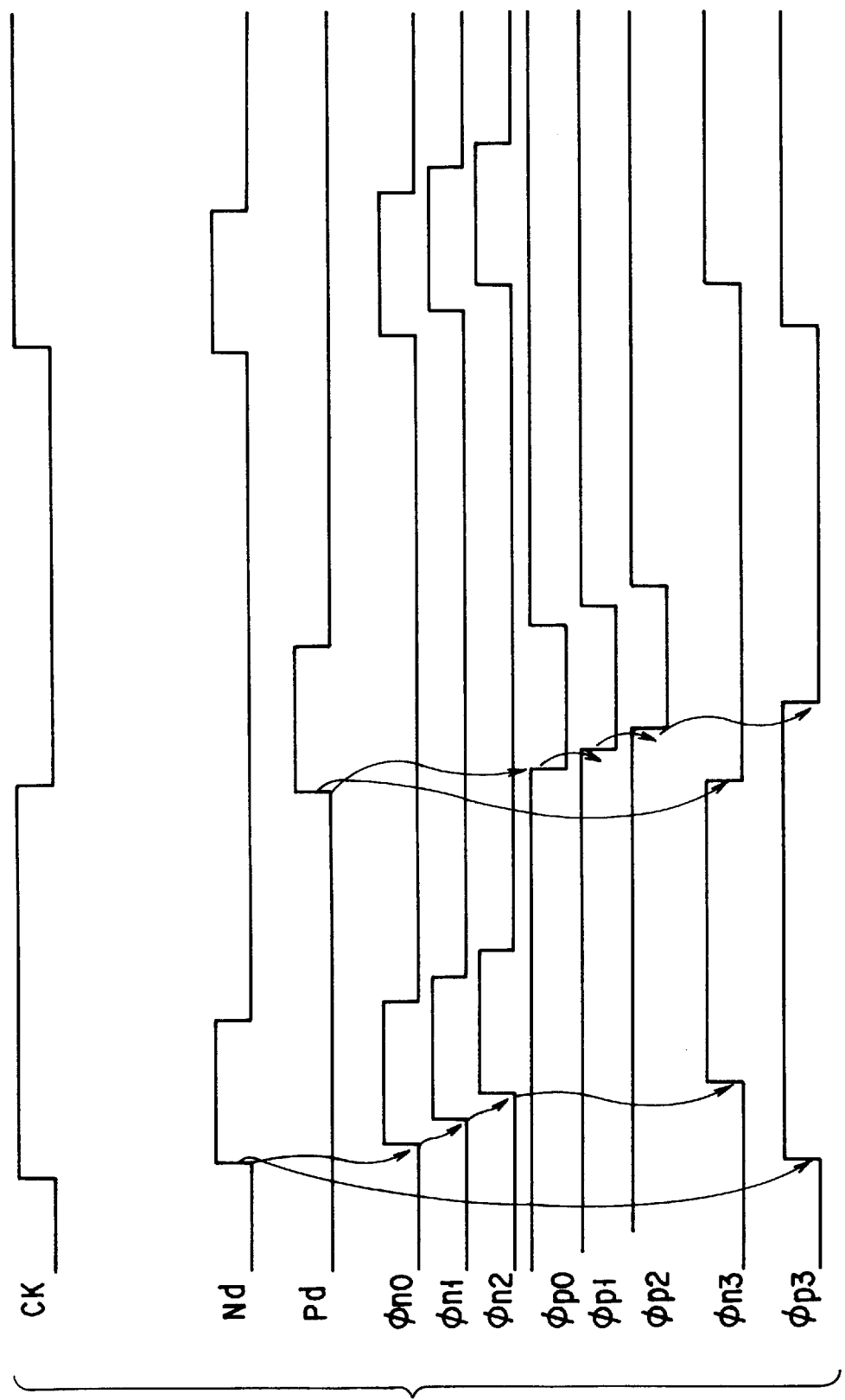
FIG. 9 is an operating timing chart of the control circuit shown in FIG. 8.

FIG. 8 shows examples of control circuits for controlling signals to be supplied to respective switches shown in FIGS. 4 and 6. In addition, FIG. 9 is a timing chart thereof.

In FIG. 8, a delay circuit 1 determines the pulse width of a clock such as $\phi_{n0}$ of FIG. 5, and it is sufficient if a margin is large. A delay circuit 2 indicates a timing difference between the $\phi_{n1}$ and $\phi_{n2}$, which need only be arranged to be equivalent to the time for which the output changes from Vcc/2 to Vcc/4. If this timing difference is reduced to be small, high-speed operation can be achieved while the reduction rate of the dissipated energy is reduced. Therefore, the timing difference may be reduced in accordance with the application purposes.

(Embodiment 4)

Figure 10:
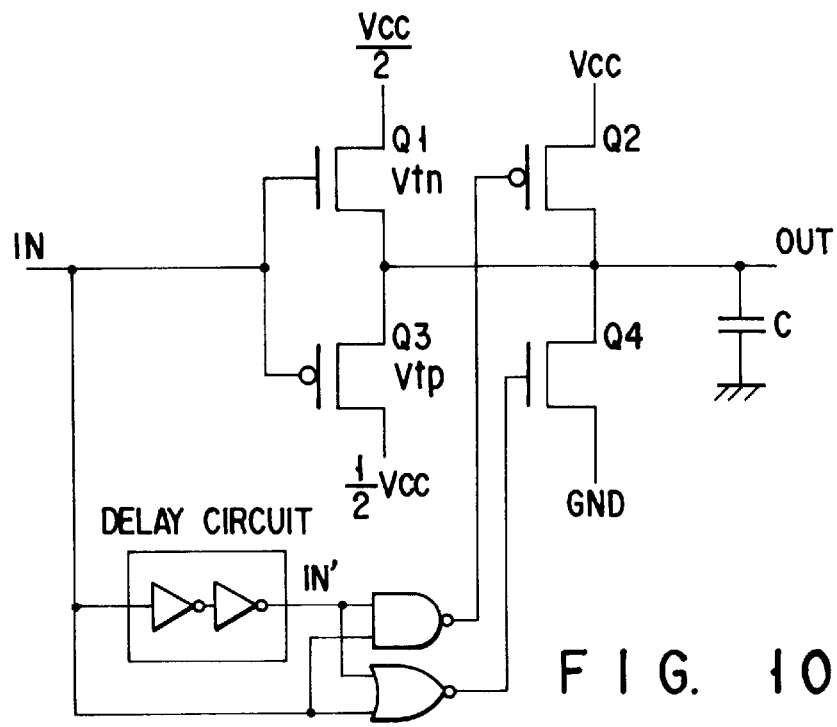
FIG. 10 shows a circuit configuration of a logic circuit according to the fourth embodiment.
Figure 11:
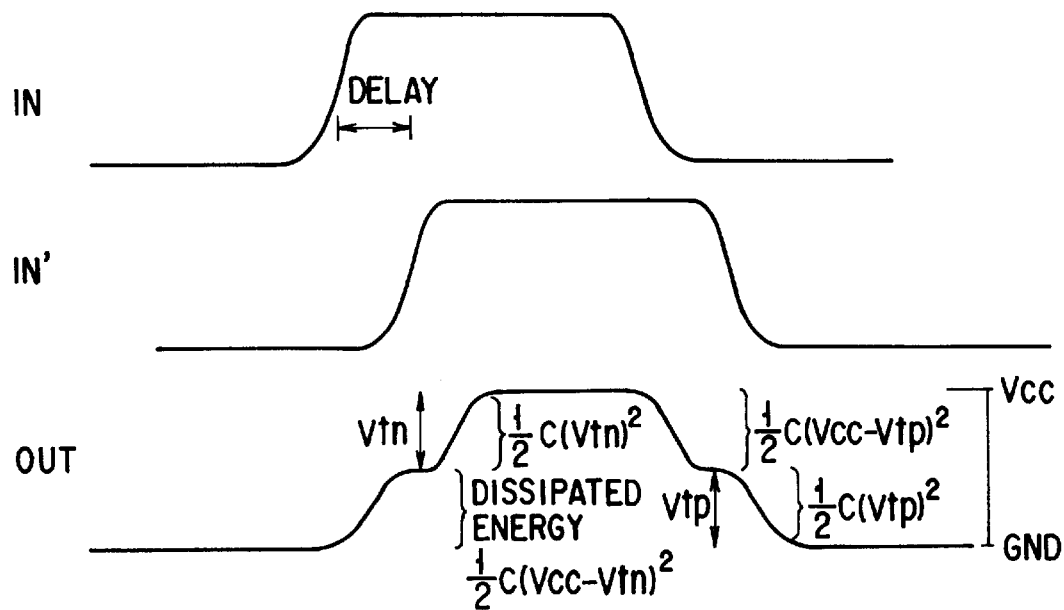
FIG. 11 is an operating timing chart for explaining the operation according to the fourth embodiment.

FIG. 10 shows a circuit configuration of a logic circuit according to a fourth embodiment of the present invention. FIG. 11 is an operating timing chart thereof.

In this embodiment, only one intermediate power source of Vcc/2 is used, and further, a switch and a rectifier are formed of one single transistor. In addition, switches connected to the power source potential Vcc and the grounded GND are supplied with input signals through a delay circuit.

In this embodiment, for example, when the output is raised from the GND to the Vcc, the input IN rises from the GND to the VCC, and the transistor Q$_1$ is turned ON. In this state, the output OUT rises to Vcc/2 if an equation of the threshold voltage Vtn=Vcc/2 is satisfied.

Then, the transistor Q$_2$ is turned ON after a time difference by the delay circuit, so that the output OUT increases to Vcc. In this state, the transistor Q$_1$ has a gate voltage of Vcc and a source voltage of Vcc/2, and therefore, is not turned ON as long as the drain is Vcc/2 or more where Vtn=Vcc/2 is satisfied. Therefore, the rectifying function is effected, thereby preventing a reversed flow. When the output decreases from Vcc to GND, the transistors are turned ON in an order of Q$_3$ to Q$_4$, thereby achieving the same function.

Further, where an equation of Vtp=Vtn=Vcc/2 is satisfied, the heat energy dissipated is reduced by half in comparison with a conventional circuit. Where a relationship of Vtp=Vtn>Vcc/2 is satisfied, the heat energy becomes $$\{C·(Vtn)^2/2+C·(Vcc-Vtn)^2/2\}$$

when the output is pulled up, and the heat energy becomes $$\{C·(|Vtp|)^2/2+C·(Vcc-|Vtn|)^2/2\}.$$

Thus, the heat energy is reduced more than in a conventional circuit.

In addition, where Vtp=Vtn<Vcc/2, the transistors $Q_2$ and $Q_4$ are turned ON, and a reversed flow occurs at beginning. Then, the rectifying function is effected as the output potential changes to be close to Vcc or GND. Therefore, there are not problems as long as the threshold voltage is slightly lower than Vcc/2.

Note that the present invention is not limited to the embodiments described above. In the embodiments, in order to obtain intermediate power source potentials Vm, the difference between the Vcc and the GND is divided by two or four. However, the number of intermediate power source potentials is not limited at all, but may be appropriately varied upon requirements from design specifications.

The present invention is suitable for a circuit which has a large load capacitance for an output and which allows the output to be pulled up and down slowly. Therefore, the present invention is preferably applicable to, for example, a system block drive circuit, a clock drive line, an output circuit (e.g., an output buffer), or the like for an LSI such as an MPU, DSP, a controller or the like. This is because the system clock of these circuits adopts a larger cycle in comparison with the delay of respective gates in the LSI. In addition, the present invention is effective for a bus line or the like using a number of bits in various LSIs and memories.

Otherwise, the present invention can be variously modified and practiced, without deviating from the subject matter of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A logic circuit comprising:
    an output line;
    a first switch having an end connected to the output line and another end connected to a power source potential;
    a second switch having an end connected to the output line and another end connected to a ground potential; and
    a switching/rectifying circuit, which has an end connected to the output line and another end connected to an intermediate power source potential, for switching/rectifying, in which said intermediate power source potential is higher than the ground potential and lower than the power source potential.

2. A logic circuit according to claim 1, wherein said switching/rectifying circuit includes a third switch and a rectifier connected in series.

3. A logic circuit according to claim 2, wherein said rectifier includes at least one of a pn-junction element and a MOS transistor, wherein said MOS transistor includes a gate connected to one of a drain and a source of said MOS transistor.

4. A logic circuit according to claim 1, further comprising a stabilizing capacitance connected to the intermediate power source potential.

5. A logic circuit according to claim 1, wherein said logic circuit is implemented on a semiconductor chip, said semiconductor chip including another circuit that generates the intermediate power source potential.

6. A logic circuit according to claim 1, wherein said logic circuit is implemented on a semiconductor chip, and wherein the intermediate power source potential is directly generated by an AC/DC converter not included in said semiconductor chip.

7. A logic circuit comprising:
    an output line;
    a first switch having an end connected to the output line and another end connected to a power source potential;
    a second switch having an end connected to the output line and another end connected to a ground potential; and
    a plurality of first and second switching/rectifying circuits, each of which has an end connected to the output line and another end connected in parallel to each of a plurality of intermediate power source potentials, respectively, which are different from each other and are higher than the ground potential and lower than the power source potential, wherein
    the first switching/rectifying circuits prespectively allow currents to flow when the potential of the output line is lower than associated ones of the intermediate power source potentials, and the second switching/rectifying circuits respectively allow currents to flow when the potential of the output line is higher than associated ones of the intermediate power source potentials.

8. A logic circuit according to claim 7, wherein each of the first switching/rectifying circuits includes a third switch and a first rectifying circuit, and each of the second switching/rectifying circuits includes a fourth switch and a second rectifying circuit.

9. A logic circuit according to claim 8, wherein each of said first and second rectifying circuits includes at least one of a pn-junction element and a MOS transistor, wherein said MOS transistor includes a gate connected to one of a drain and a source of said MOS transistor.

10. A logic circuit according to claim 8, wherein
    the potential of the output line is within a range of the ground potential and the power source potential,
    when the potential of the output line falls from the power source potential to the ground potential, the fourth switches of the second switching/rectifying circuits are turned ON, one after another, in an order from the fourth switch of that second switching/rectifying circuit which is connected to the highest one of the plurality of intermediate power source potentials, and finally, the second switch is turned ON, and
    when the potential of the output line rises from the ground potential to the power source potential, the third switches of the first switching/rectifying circuits are turned ON, one after another, in an order from the third switch of that first switching/rectifying circuit which is connected to the lowest one of the plurality of intermediate power source potentials, and finally, the first switch is turned ON.

11. A logic circuit according to claim 10, wherein at least two of the first to fourth switches are simultaneously kept turned ON during operation to make the potential of the output line rise and fall.

12. A logic circuit according to claim 7, further comprising a stabilizing capacitance connected to at least one of the plurality of intermediate power source potentials.

13. A logic circuit according to claim 7, wherein said logic circuit is implemented on a semiconductor chip, said semiconductor chip including another circuit that generates at least one of the plurality of intermediate power source potentials.

14. A logic circuit according to claim 7, wherein said logic circuit is implemented on a semiconductor chip, and wherein at least one of the plurality of intermediate power source potentials is directly generated by an AC/DC converter not included in said semiconductor chip.

15. A semiconductor device comprising at least one of a clock generator and a data line, each of which uses the logic circuit according to claim 1.

16. A semiconductor device comprising at least one of a clock generator and a data line, each of which uses the logic circuit according to claim 7.

* * * * *